(12) United States Patent
Han et al.

(10) Patent No.: US 11,089,678 B2
(45) Date of Patent: Aug. 10, 2021

(54) COMPOSITE CONDUCTIVE SUBSTRATE AND MANUFACTURING METHOD THEREOF

(71) Applicant: KOREA ELECTRONICS TECHNOLOGY INSTITUTE, Seongnam-si (KR)

(72) Inventors: Chuljong Han, Yongin-si (KR); Minsuk Oh, Seoul (KR); Eunji Ko, Seongnam-si (KR); Hongseon Park, Goyang-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 0 days.

(21) Appl. No.: 16/263,450

(22) Filed: Jan. 31, 2019

(65) Prior Publication Data
US 2020/0253046 A1    Aug. 6, 2020

(51) Int. Cl.
| | | |
|---|---|---|
| *B32B 3/00* | (2006.01) | |
| *H05K 1/05* | (2006.01) | |
| *H05K 3/46* | (2006.01) | |
| *H05K 3/28* | (2006.01) | |

(Continued)

(52) U.S. Cl.
CPC ............. *H05K 1/056* (2013.01); *C03C 17/40* (2013.01); *H05K 1/028* (2013.01); *H05K 3/285* (2013.01); *H05K 3/4608* (2013.01); *H05K 3/4644* (2013.01); *C03C 2217/256* (2013.01); *C03C 2218/154* (2013.01);

(Continued)

(58) Field of Classification Search
None
See application file for complete search history.

(56) References Cited

U.S. PATENT DOCUMENTS

| | | | | |
|---|---|---|---|---|
| 2008/0010707 A1* | 1/2008 | Zhang | ................ | B81C 1/00182 257/40 |
| 2013/0252394 A1* | 9/2013 | Lee | ...................... | H01L 45/145 438/382 |

(Continued)

FOREIGN PATENT DOCUMENTS

| | | |
|---|---|---|
| CN | 108766630 A | 11/2018 |
| JP | 2015-089924 A | 5/2015 |

(Continued)

OTHER PUBLICATIONS

Extended European Search Report dated Jul. 25, 2019 in counterpart European Patent Application No. 19154859.3 (6 pages in English).

*Primary Examiner* — Seth Dumbris
(74) *Attorney, Agent, or Firm* — NSIP Law

(57) ABSTRACT

The present disclosure provides a composite conductive substrate exhibiting enhanced properties both in the folding endurance and the electric conductivity and a method of manufacturing the composite conductive substrate. A composite conductive substrate according to an exemplary embodiment of the present disclosure includes: an insulating layer; a metal nanowire structure embedded beneath one surface of the insulating layer; and a metal thin film coupled to the metal nanowire structure. The composite conductive substrate may be fabricated in an order of the insulating film, the metal nanowire structure, and the metal thin film, or vice versa.

5 Claims, 5 Drawing Sheets

(51) Int. Cl.
*H05K 1/02* (2006.01)
*C03C 17/40* (2006.01)
(52) U.S. Cl.
CPC ............... *H05K 2201/0145* (2013.01); *H05K 2201/0154* (2013.01); *H05K 2201/026* (2013.01); *Y10T 428/24917* (2015.01)

(56) References Cited

U.S. PATENT DOCUMENTS

| | | | |
|---|---|---|---|
| 2014/0035599 A1* | 2/2014 | Shimata | G06F 3/044 |
| | | | 324/658 |
| 2014/0202738 A1* | 7/2014 | Allemand | C09D 5/24 |
| | | | 174/251 |
| 2015/0101849 A1* | 4/2015 | Bockmeyer | H05K 1/097 |
| | | | 174/257 |
| 2017/0047512 A1* | 2/2017 | Bessonov | H01L 45/1253 |
| 2018/0335874 A1* | 11/2018 | Li | G06F 3/0412 |
| 2019/0227650 A1* | 7/2019 | Fang | G06F 3/044 |

FOREIGN PATENT DOCUMENTS

| | | |
|---|---|---|
| KR | 10-2016-0077456 A | 7/2016 |
| KR | 10-1874550 B1 | 7/2018 |
| WO | 2011/105679 A2 | 9/2011 |

\* cited by examiner

10

COMPOSITE CONDUCTIVE SUBSTRATE AND MANUFACTURING METHOD THEREOF

TECHNICAL FIELD

The present disclosure relates to a conductive substrate and a method of manufacturing the conductive substrate. More particularly, the present disclosure relates to a composite conductive substrate having superior folding endurance property and electrical conductivity and a method of manufacturing the composite conductive substrate.

BACKGROUND

Materials having a metallic conductive layer and a polymer insulating layer have widely been used as bases for conductive substrates such as printed circuit boards. Flexibility is a major performance factor for these layered materials, and efforts have been made to develop techniques for improving the flexibility of the layered materials.

Adhesion between the metallic layer and the polymer insulating layer is also a very important factor. In order to improve the adhesion between the layers, techniques for chemically modifying a contact surface as well as forming physical protrusions at the contact surface have been studied.

Recently, techniques of embedding metallic material into the polymer insulating material to increase the flexibility has been developed. The embedding techniques are particularly effective when the embedded materials are metal nanowires. The metal nanowires can greatly increase the contact area with the polymer insulating material compared to another forms of metallic materials, which may be also helpful to increase the adhesion between the embedded metals and the polymer insulating material. Korean patent No. 10-1693486 entitled COATING SOLUTION HAVING SILVER NANOWIRE, CONDUCTIVE FILM, AND MANUFACTURING METHOD THEREOF and issued to the present applicant may be an example of embedding the metal nanowires in the polymer material.

Even though exhibiting an enhanced folding endurance property, the conductive substrate with embedded metal nanowires reveals a problem in electrical conductivity characteristics. That is, a thin diameter of the metal nanowire limits a current that may flow through the metal nanowire and decreases a resistance of the metal nanowire compared with a film-shaped metal. Therefore, it is required to develop a new conductive substrate that may secure both the folding endurance property and the electric conductivity.

SUMMARY

Provided are a composite conductive substrate exhibiting enhanced properties both in the folding endurance and the electric conductivity and a method of manufacturing the composite conductive substrate.

Additional aspects will be set forth in part in the description which follows and, in part, will be apparent from the description, or may be learned by practice of the presented exemplary embodiments.

According to an aspect of an exemplary embodiment, a composite conductive substrate includes: an insulating layer; a metal nanowire structure embedded beneath one surface of the insulating layer; and a metal thin film coupled to the metal nanowire structure.

The insulating layer may be formed of a insulating material such as polyimide, polyurethane, polydimethylsiloxane (PDMS), polyethersulphone (PES), polyacrylate (PAR), polyetherimide (PEI), polyethyelene napthalate (PEN), polyethylene terephthalate (PET), polyphenylene sulfide (PPS), polyallylate, polycarbonate (PC), cellulose triacetate cellulose triacetate (CTA), and cellulose acetate propinonate (CAP).

The metal nanowire structure may include silver nanowires.

The silver nanowires may have aspect ratios of 1:2 to 1:1,000,000,000.

The metal thin film may be a silver thin film.

According to an aspect of another exemplary embodiment, a method of manufacturing a composite conductive substrate includes: forming a metal nanowire structure on a metal thin film; and forming an insulating layer on the metal thin film to embed the metal nanowire structure.

The method of manufacturing a composite conductive substrate may further include: forming the metal thin film on a base substrate before forming the metal nanowire structure.

The of manufacturing a composite conductive substrate may further include: separating the composite conductive substrate comprising the metal thin film, the metal nanowire structure, and the insulating layer, from the base substrate, after the insulating layer is formed.

The metal nanowire structure may include silver nanowires, and the metal thin film may be a silver thin film.

According to another aspect of another exemplary embodiment, a method of manufacturing a composite conductive substrate includes: forming an insulating layer; forming a metal nanowire structure to be embedded beneath one surface of the insulating layer; and forming a metal thin film to be coupled to the metal nanowire structure formed beneath one surface of the insulating layer.

The metal nanowire structure may include silver nanowires, and the metal thin film may be a silver thin film.

The silver nanowires may have aspect ratios of 1:2 to 1:1,000,000,000.

Because of a structure that the metal nanowire structure is embedded in the insulating layer and the metal thin film is formed on the embedded metal nanowire structure, the composite conductive substrate may exhibit both a superior folding endurance property and a high electrical conductivity due to the embedded metal nanowire structure and the metal thin film, respectively.

That is, while utilizing the high electrical conductivity of the metal thin film, the composite conductive substrate according to the present disclosure compensates for the low adhesion between the metal thin film and the insulating layer by applying the metal nanowire structure to the metal thin film.

On the other hand, while utilizing the superior folding endurance property of the embedded metal nanowire structure, the composite conductive substrate compensates for the low electrical conductivity of the metal nanowire structure by applying the metal thin film to the metal nanowire structure.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings, in which.

Figure 1:
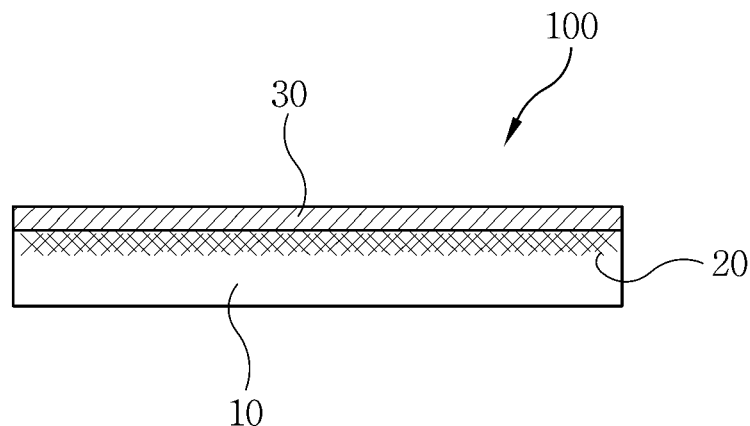
FIG. 1 is a cross-sectional view illustrating a composite conductive substrate according to an exemplary embodiment of the present disclosure.

The drawings described herein are for illustration purposes only and are not intended to limit the scope of the present disclosure in any way.

DETAILED DESCRIPTION

In the following description and the accompanied drawings, only parts necessary for understanding embodiments of the present disclosure will be described, and the descriptions of well-known functions or configurations that may obscure the subject matter of the present disclosure will be omitted for simplicity.

The terms and words used in the following description and appended claims are not necessarily to be construed in an ordinary sense or a dictionary meaning, and may be appropriately defined herein to be used as terms for describing the present disclosure in the best way possible. Such terms and words should be construed as meaning and concept consistent with the technical idea of the present disclosure. The embodiments described in this specification and the configurations shown in the drawings are merely preferred embodiments of the present disclosure and are not intended to limit the technical idea of the present disclosure. Therefore, it should be understood that there may exist various equivalents and modifications which may substitute the exemplary embodiments at the time of filing of the present application.

FIG. 1 is a cross-sectional view illustrating a composite conductive substrate according to an exemplary embodiment of the present disclosure.

Referring to FIG. 1, a composite conductive substrate 100 according to an embodiment of the present disclosure includes an insulating layer 10, a metal nanowire structure 20, and a metal thin film 30. The metal nanowire structure 20 is embedded beneath one surface of the insulating layer 10. The metal thin film 30 is coupled to the metal nanowire structure 20.

The insulating layer 10 may be formed of a polymer plastic material having an insulating property. For example, the insulating layer 10 may be formed of polyimide, polyurethane, polydimethylsiloxane (PDMS), polyethersulphone (PES), polyacrylate (PAR), polyetherimide (PEI), polyethylene napthalate (PEN), polyethylene terephthalate (PET), polyphenylene sulfide (PPS), polyallylate, polycarbonate (PC), cellulose triacetate cellulose triacetate (CTA), or cellulose acetate propinonate (CAP).

The metal nanowire structure 20 is formed to be embedded beneath one surface of the insulating layer 10. The metal nanowire structure 20 includes metal nanowires such as silver nanowires, copper nanowires, and gold nanowires. In the case that the silver nanowires are used as the metal nanowires, the silver nanowires having aspect ratios of 1:2 to 1:1,000,000,000 are used so that the silver nanowires can form a network structure.

The metal nanowire structure 20 is formed by coating a metal nanowire dispersion. The coating method may be a bar coating, a slit die coating, a micro gravure coating, or the like. The metal nanowire dispersion may include metal nanowires and a dispersion agent. Examples of the dispersion agent may include hydroxypropyl methylcellulose (HPMC), carboxymethyl cellulose (CMC), and 2-hydroxyethyl cellulose (HC). The metal nanowire dispersion may further include additives such as an anticorrosive agent and a wettability improving agent as well as a solvent in addition to the metal nanowires and the dispersion agent. Examples of the solvent may include, but is not limited thereto, water and an organic solvent such as ethanol and isopropyl alcohol.

The metal thin film 30 is formed on the metal nanowire structure 20 and is coupled to the metal nanowire structure 20. The metal thin film 30 may be deposited by vacuum sputtering, for example. The metal thin film 30 may be formed to a thickness of 50-150 nanometers (nm). For example, in case that the metal nanowire structure 20 and the metal thin film 30 are made of silver, the metal thin film 30 may be formed through a silver mirror reaction.

The metal thin film 30 may be made of the same material as the metal nanowire structure 20 for a good bonding with the metal nanowire structure 20. For example, in the case that silver nano wire is used as the metal nanowire, it is preferable to use a silver thin film as the metal thin film 30.

Because of a structure that the metal nanowire structure 20 is embedded in the insulating layer 10 and the metal thin film 30 is formed on the embedded metal nanowire structure 20, the composite conductive substrate 100 may exhibit both a superior folding endurance property and a high electrical conductivity due to the embedded metal nanowire structure 20 and the metal thin film 30, respectively.

That is, while utilizing the high electrical conductivity of the metal thin film 30, the composite conductive substrate 100 according to the present disclosure compensates for the low adhesion between the metal thin film 30 and the insulating layer 10 by applying the metal nanowire structure 20 to the metal thin film 30.

On the other hand, while utilizing the superior folding endurance property of the embedded metal nanowire structure 20, the composite conductive substrate 100 compensates for the low electrical conductivity of the metal nanowire structure 20 by applying the metal thin film 30 to the metal nanowire structure 20.

The composite conductive substrate 100 according to the present disclosure may be manufactured by two methods shown in FIGS. 2 through 11.

A method of manufacturing the composite conductive substrate 100 according to a first embodiment of the present disclosure will now be described with reference to FIGS. 2 through 7.

Figure 2:
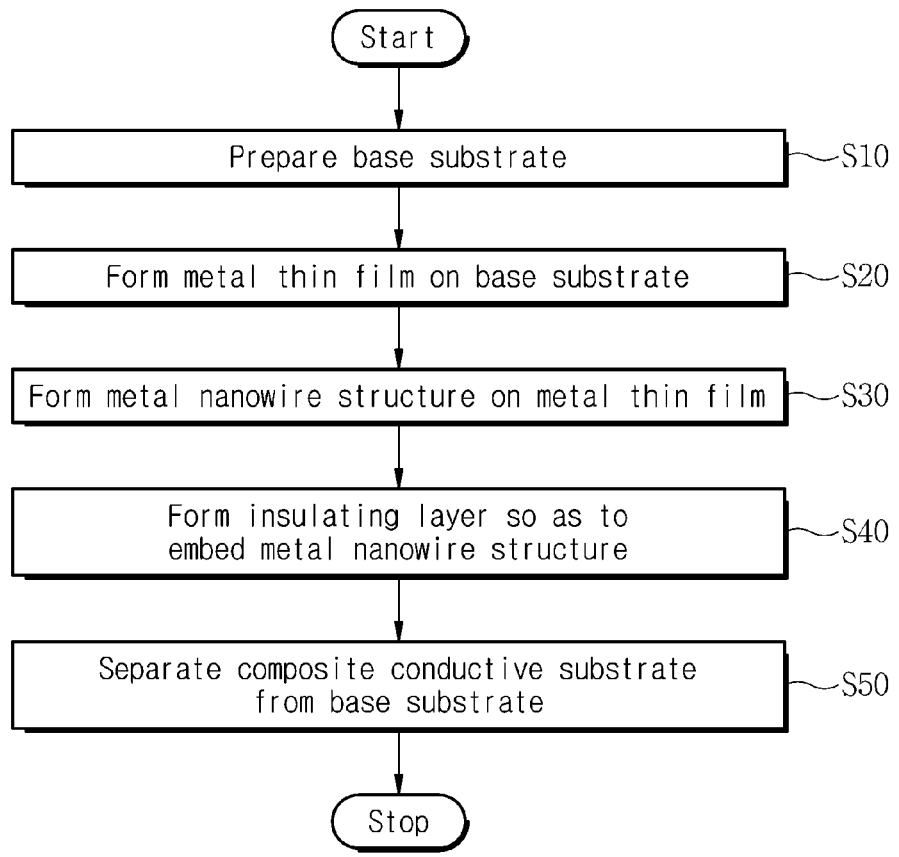
FIG. 2 is a flowchart illustrating a method of manufacturing a composite conductive substrate according to a first embodiment of the present disclosure.

FIG. 2 is a flowchart illustrating a method of manufacturing the composite conductive substrate 100 according to a first embodiment of the present disclosure. FIGS. 3 through 7 are cross-sectional views illustrating processing steps of the method of manufacturing the composite conductive substrate shown in FIG. 2.

Figure 3:
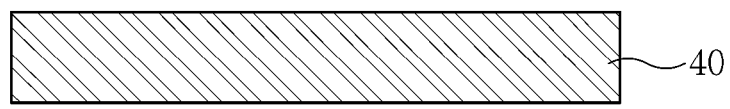
FIGS. 3 through 7 are cross-sectional views illustrating processing steps of the method of manufacturing the composite conductive substrate shown in FIG. 2.

First, in step S10, a base substrate 40 on which the composite conductive substrate 100 may be formed is prepared as shown in FIG. 3. A glass, quartz, glass wafer, silicon wafer, or ceramic substrate may be used for the base substrate 40.

Figure 4:
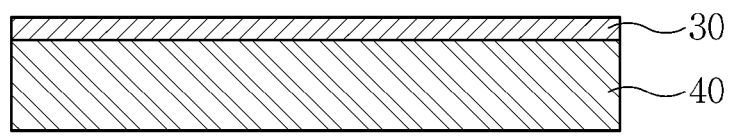

Subsequently, in step S20, the metal thin film 30 is formed on the base substrate 40 as shown in FIG. 4. The metal thin film 30 can be formed on the base substrate 40 by a vacuum sputtering process, for example.

Figure 5:
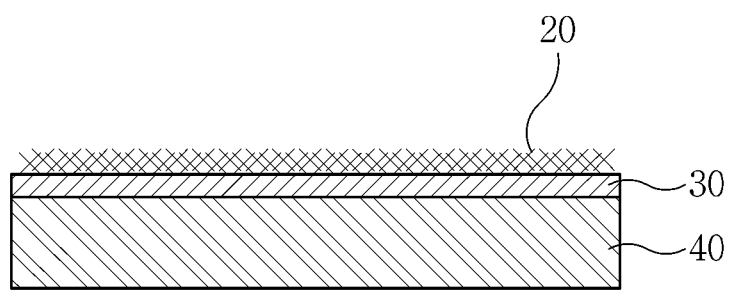

Next, in step S30, the metal nanowire structure 20 is formed on the metal thin film 30 as shown in FIG. 5. The metal nanowire structure 20 is formed by, for example, coating the metal nanowire dispersion on the metal thin film 30 and then drying the metal nanowire dispersion by hot air to attach the metal nanowires on the metal thin film 30. Afterwards, heat or light is irradiated to the metal nanowires attached on the metal thin film 30, so that the metal nanowires are welded on the metal thin film 30 to form the metal nanowire structure 20.

Figure 6:
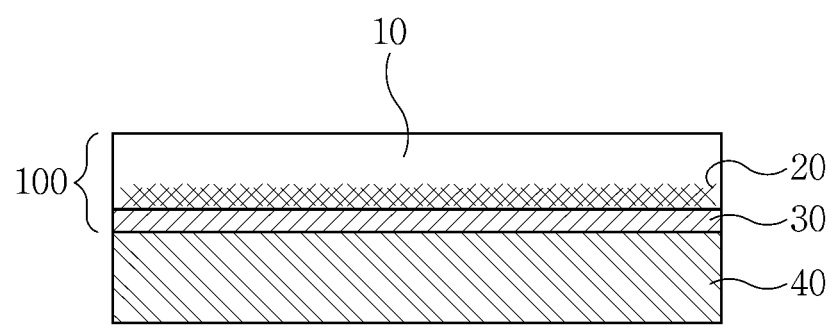

In step S40, the insulating layer 10 is formed on the metal thin film 30 so as to embed the metal nanowire structure 20 as shown in FIG. 6. The insulating layer 10 may be formed by, for example, coating a liquid material of the insulating layer 10 on the metal thin film 30 on which the metal nanowire structure 20 is formed and then curing the liquid-state insulating layer 10 in a state that the metal nanowire structure 20 is embedded in the insulating layer 10.

Through this process, the composite conductive substrate 100 including the metal thin film 30, the metal nanowire structure 20, and the insulating layer 10 may be formed on the base substrate 40.

Figure 7:
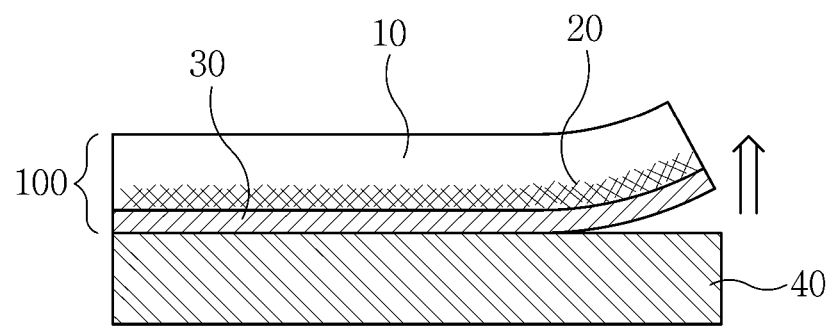

Finally, in step S50, the composite conductive substrate 100 according to the present disclosure may be obtained by separating the composite conductive substrate 100 from the base substrate 40 as shown in FIG. 7.

Although the metal thin film 30, the metal nanowire structure 20, and the insulating layer 10 are formed in this order according to the first embodiment of the method of manufacturing the composite conductive substrate 100, the present disclosure is not limited thereto. For example, in a second embodiment of the manufacturing method according to the present disclosure, the composite conductive substrate 100 may be manufactured in a reverse order of the first embodiment.

Figure 8:
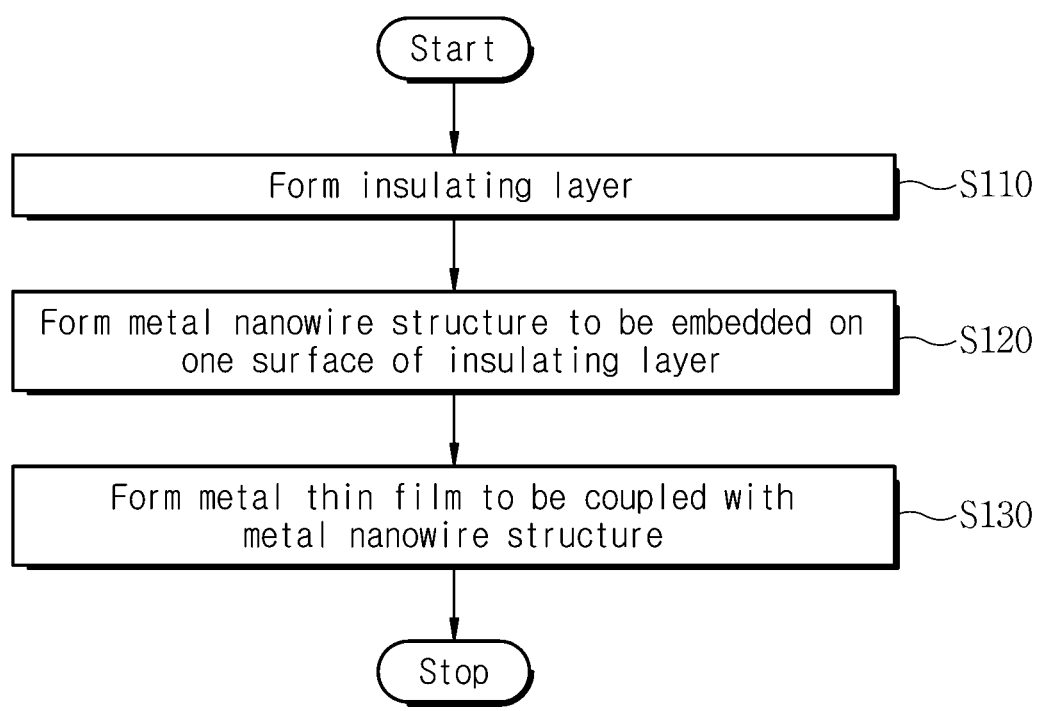
FIG. 8 is a flowchart illustrating a method of manufacturing a composite conductive substrate according to a second embodiment of the present disclosure.
Figure 9:
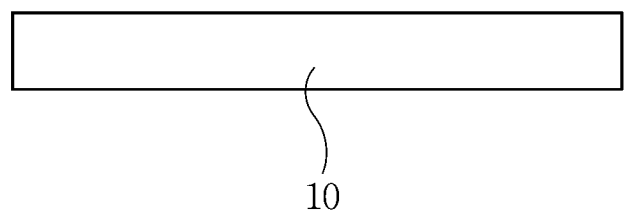
FIGS. 9 through 11 are cross-sectional views illustrating processing steps of the method of manufacturing the composite conductive substrate shown in FIG. 8.
Figure 10:
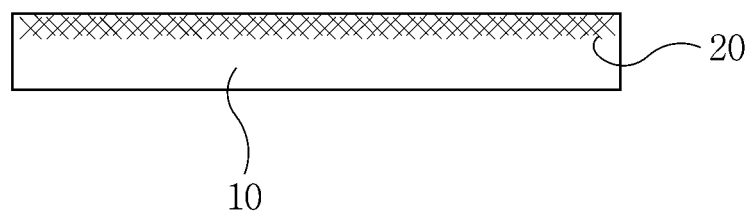
Figure 11:
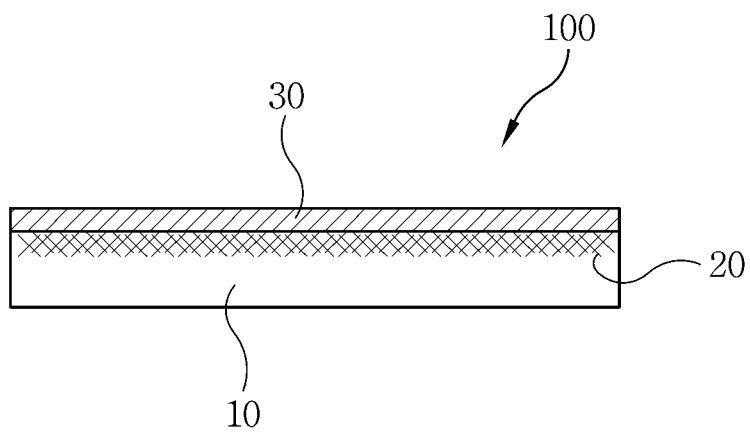

FIG. 8 is a flowchart illustrating a method of manufacturing the composite conductive substrate 100 according to a second embodiment of the present disclosure. FIGS. 9 through 11 are cross-sectional views illustrating processing steps of the method of manufacturing the composite conductive substrate shown in FIG. 8.

First, in step S110, the insulating layer 10 is provided as shown in FIG. 9. The insulating layer 10 may be formed by, for example, coating a liquid material of the insulating layer 10 on a base substrate (not shown) and then curing the liquid-state insulating layer 10. Alternatively, the insulating layer 10 may be provided in a form of a film.

Subsequently, in step S120, the metal nanowire structure 20 is formed on one surface of the insulating layer 10 so as to be embedded in the insulating layer 10 as shown in FIG. 10. The metal nanowire structure 20 is formed by, for example, coating the metal nanowire dispersion on one surface of the insulating layer 10 and then drying the metal nanowire dispersion by hot air to attach the metal nanowires on the insulating layer 10. Afterwards, heat or light is irradiated to the metal nanowires attached on the insulating layer 10, so that the metal nanowire structure 20 is formed in a state of being embedded in the insulating layer 10.

Finally, in step S130, the metal thin film 30 is formed on the insulating layer 10 to be coupled to the metal nanowire structure 20 as shown in FIG. 11. For example, in case that the metal nanowire structure 20 and the metal thin film 30 are made of silver, the metal thin film 30 may be formed through a vacuum sputtering or silver mirror reaction process.

In order to check the folding endurance property and the electric conductivity of the composite conductive substrate 100 according to the present disclosure, conductive substrates were prepared according to the following examples and comparative examples and properties of the conductive substrates were tested.

Example 1

A glass substrate coated with a silver thin film having a thickness of 100 nm is prepared by vacuum sputtering. Silver nanowire dispersion (1.0 weight percent (wt %), NANOPYXIS Co., Ltd.) dispersed in isopropyl alcohol (IPA) is coated on a surface of the silver thin film by bar coating and then dried by hot air at 80° C. Subsequently, intense pulsed light (IPL: 2.0 Kilowatts (Kw), XENON Corp.) is irradiated 20 times on the surface of the silver thin film to cause welding between the silver nanowires and the silver thin film, so that a silver nanowire structure is formed. A polyimide varnish is coated on the silver nanowire structure and then the cured and dried at 300° C. to manufacture a composite conductive substrate of Example 1 on the glass substrate. Then, the composite conductive substrate of Example 1 is obtained by separating the composite conductive substrate of Example 1 from the glass substrate.

Comparative Example 1

A glass substrate coated with a silver thin film having a thickness of 100 nm is prepared by vacuum sputtering. A polyimide varnish is coated on the silver thin film and then the cured and dried at 300° C. to manufacture a composite conductive substrate of Comparative Example 1 on the glass substrate. Then, the composite conductive substrate of Comparative Example 1 is obtained by separating the composite conductive substrate of Example 1 from the glass substrate.

Comparative Example 2

Silver nanowire dispersion (1.0 wt %, NANOPYXIS) dispersed in isopropyl alcohol (IPA) is coated on a surface of a glass substrate by bar coating and then dried by hot air at 80° C. Subsequently, intense pulsed light (2.0 Kw, XENON) is irradiated 20 times on the surface of the glass substrate to cause welding between the silver nanowires, so that a silver nanowire structure is formed. A polyimide varnish is coated on the silver nanowire structure and then the cured and dried at 300° C. to manufacture a composite conductive substrate of Comparative Example 2 on the glass substrate. Then, the composite conductive substrate of Comparative Example 2 is obtained by separating the composite conductive substrate of Comparative Example 2 from the glass substrate.

Example 2

A film-shaped insulating layer is formed by thermoplastic polyurethane resin. The insulating layer has a thickness of 75 micrometers (μm) and an area of 5 cm×5 cm. Silver nanowire dispersion (1.0 wt %, NANOPYXIS) dispersed in isopropyl alcohol (IPA) is coated on the insulating layer by bar coating and then dried by hot air at 80° C. Subsequently, intense pulsed light (IPL: 2.0 Kw, XENON) is irradiated 20 times on the insulating layer to cause welding between the silver nanowires, so that a silver nanowire structure is embedded in the insulating layer. Afterwards, the surface of the insulating layer embedded with the silver nanowire structure is washed with a methanol solution to remove the silver nanowires remaining on the surface of the insulating layer without being embedded in the insulating layer. A silver thin film is formed on the silver nanowire structure by vacuum sputtering to obtain a composite conductive substrate according to Example 2.

Example 3

A film-shaped insulating layer is formed by thermoplastic polyurethane resin. The insulating layer has a thickness of 75 μm and an area of 5 cm×5 cm. Silver nanowire dispersion (1.0 wt %, NANOPYXIS) dispersed in isopropyl alcohol (IPA) is coated on the insulating layer by bar coating and then dried by hot air at 80° C. Subsequently, intense pulsed light (IPL: 2.0 Kw, XENON) is irradiated 20 times on the insulating layer to cause welding between the silver nanowires, so that a silver nanowire structure is embedded in the insulating layer. Afterwards, the surface of the insulating layer embedded with the silver nanowire structure is washed with a methanol solution to remove the silver nanowires remaining on the surface of the insulating layer without being embedded in the insulating layer. A silver thin film is formed on the silver nanowire structure by a silver mirror reaction to obtain a composite conductive substrate according to Example 3.

Here, the silver mirror reaction is a process of forming a silver thin film on the silver nanowire structure by using silver nitrate and a glucose solution.

Comparative Example 3

A film-shaped insulating layer is formed by thermoplastic polyurethane resin. The insulating layer has a thickness of 75 μm and an area of 5 cm×5 cm. Silver nanowire dispersion (1.0 wt %, NANOPYXIS) dispersed in isopropyl alcohol (IPA) is coated on the insulating layer by bar coating and then dried by hot air at 80° C. Subsequently, intense pulsed light (IPL: 2.0 Kw, XENON) is irradiated 20 times on the insulating layer to cause welding between the silver nanowires, so that a silver nanowire structure is embedded in the insulating layer. Afterwards, a composite conductive substrate according to Comparative Example 3 is obtained by washing the surface of the insulating layer embedded with the silver nanowire structure with a methanol solution to remove the silver nanowires remaining on the surface of the insulating layer without being embedded in the insulating layer.

Comparative Example 4

A film-shaped insulating layer is formed by thermoplastic polyurethane resin. The insulating layer has a thickness of 75 μm and an area of 5 cm×5 cm. A composite conductive substrate according to Comparative Example 4 is obtained by forming a silver thin film on the insulating layer by a silver mirror reaction.

The conductive substrates manufactured according to the examples and the comparative examples described above were subjected to a folding endurance test using a MIT folding endurance testing machine (radius of curvature: 0.5 mm) while measuring electrical resistances. The experimental results are summarized in Table 1.

TABLE 1

| | Structure | Resistance (Ohm/sq) | Folding Endurance (Resistance rising point by 10% or more) | Note |
|---|---|---|---|---|
| Example 1 | Polyimide/Silver nanowire structure/Silver thin film | 1.2 | 105,000 | Silver thin film is formed by deposition |
| Comparative Example 1 | Polyimide/Silver thin film | 3.1 | 8,400 | Silver thin film is formed by deposition |
| Comparative Example 2 | Polyimide/Silver nanowire structure | 83.0 | 83,200 | |
| Example 2 | Polyurethane/Silver nanowire structure/Silver thin film | 5.4 | 45,200 | Silver thin film is formed by deposition |
| Example 3 | Polyurethane/Silver nanowire structure/Silver thin film | 3.5 | 53,400 | Silver thin film is formed by solution |
| Comparative Example 3 | Polyurethane/Silver nanowire structure | 104.1 | 40,100 | |
| Comparative Example 4 | Polyurethane/Silver thin film | 6.1 | 5,900 | Silver thin film is formed by solution |

Referring to Table 1, it can be found that the composite conductive substrates according to Examples 1 to 3 exhibit superior folding endurance property and electrical conductivity compared with the conductive substrates having only one of the silver nanowire structure and the silver thin film.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made therein without departing from the spirit and scope as defined by the following claims.

What is claimed is:

1. A composite conductive substrate, comprising:
   an insulating layer including an upper portion and a lower portion, the upper portion having an upper surface;
   metal nanowire structures, all of the metal nanowire structures dispersed and embedded only in the upper portion of the insulating layer and not embedded in the lower portion of the insulating layer; and
   a metal thin film coupled to the metal nanowire structures, and formed above the upper surface of the insulating layer such that the metal thin film entirely encloses the upper surface of the insulating layer.

2. The composite conductive substrate as claimed in claim 1, wherein the insulating layer is formed of a insulating material selected from a group consisting of: polyimide, polyurethane, polydimethylsiloxane (PDMS), polyethersulphone (PES), polyacrylate (PAR), polyetherimide (PEI), polyethylene naphthalate (PEN), polyethylene terephthalate (PET), polyphenylene sulfide (PPS), polyallylate, polycarbonate (PC), cellulose triacetate cellulose triacetate (CTA), and cellulose acetate propinonate (CAP).

3. The composite conductive substrate as claimed in claim 1, wherein the metal nanowire structure comprises silver nanowires.

4. The composite conductive substrate as claimed in claim 3, wherein the silver nanowires have aspect ratios of 1:2 to 1:1,000,000,000.

5. The composite conductive substrate as claimed in claim 3, wherein the metal thin film is a silver thin film.

* * * * *